United States Patent [19]
Murrmann

[11] 3,877,062

[45] Apr. 8, 1975

[54] METHOD FOR PRODUCING METAL STRUCTURES UPON SEMICONDUCTOR SURFACES

[75] Inventor: Helmuth Murrmann, Munich, Germany

[73] Assignee: Siemens Aktiengesellschaft, Berlin and Munich, Germany

[22] Filed: Nov. 6, 1973

[21] Appl. No.: 413,269

Related U.S. Application Data

[60] Continuation of Ser. No. 95,392, Dec. 4, 1970, abandoned, which is a division of Ser. No. 666,582, Sept. 11, 1967, Pat. No. 3,607,479.

[30] Foreign Application Priority Data

Sept. 14, 1966 Germany .............................. 105855
Sept. 14, 1966 Germany .............................. 105859

[52] U.S. Cl. ...................................... 357/67; 357/71
[51] Int. Cl. ............................................... H01l 3/00
[58] Field of Search ....... 317/234 L, 234 N; 75/138; 357/67, 71

[56] References Cited

UNITED STATES PATENTS 2,886,432 5/1959 Schmitt et al. ......................... 75/138
2,981,877 4/1961 Noyce ................................. 317/235

*Primary Examiner*—Stanley D. Miller, Jr.
*Assistant Examiner*—William D. Larkins
*Attorney, Agent, or Firm*—Herbert L. Lerner

[57] ABSTRACT

The invention describes a method of producing fine structures, preferably those consisting of a metal coating, upon semiconductor surfaces. More particularly, the invention relates to a method of producing metal layers upon semiconductor surfaces thus providing contact areas on semiconductor circuit components. The metal coating covers the entire area of surface to be processed. According to conventional planar technique, the coated area is subsequently covered by a suitable photovarnish upon which the desired structure or configuration is impressed by photographic exposure and development of the photovarnish. The non-exposed areas of the metal coating are thereafter dissolved. According to the present invention, the metal deposition, initially covering the entire area of the surface to be processed, is given an addition of at least one metal which reduces the etching time required for subsequently eliminating the area portions not covered by the etching mask. This also stabilizes the semiconductor surface.

3 Claims, 2 Drawing Figures

METHOD FOR PRODUCING METAL STRUCTURES UPON SEMICONDUCTOR SURFACES

Figure 1:
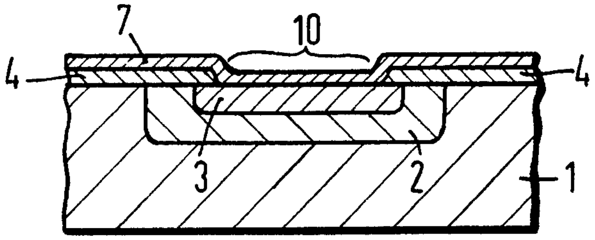

This is a continuation of application Ser. No. 95,392, filed Dec. 4, 1970, now abandoned, which application is a division of application Ser. No. 666,582, filed Sept. 11, 1967, now U.S. Pat. No. 3,607,479, issued Sept. 21, 1971.

My invention relates to a method for producing fine structures, preferably those consisting of a metal coating, upon semiconductor surfaces. More particularly, the invention concerns itself with producing metal layers upon semiconductor surfaces thus providing contact areas on semiconductor circuit components, preferably produced by planar technique. The metal coating covers the entire area of the surface to be processed. According to the conventional planar technique, the coated area is subsequently covered by a suitable photovarnish upon which the desired structure or configuration is impressed by photographic exposure and development of the photovarnish. The non-exposed areas of the metal coating are thereafter dissolved. The metal deposition, initially covering the entire area of the surface to be processed, may be given an addition of at least one metal which reduces the etching time required for subsequently eliminating the area portions not covered by the etching mask. This also stabilizes the semiconductor surface.

In the system production of electrical components, particularly micro-semiconductor components, produced by the planar technique, one of the last process steps is the defined deposition of conducting paths consisting of aluminum. This is done by providing a plate of semiconductor material, for example a monocrystalline silicon slice, from which a multiplicity of component systems are to be separated after completion of the systems, with suitable masks or stencils, and then subjecting the slices to the vapor of the desired metal, for example aluminum. However, for semiconductor component systems having a closed and very small geometrical configuration, the process of depositing metal by vaporization through a mask is not suitable since the marginal zones of the vaporized areas on the semiconductor crystalline surfaces are only incompletely formed, as a result of the shadow effect of the masks.

Such difficulties are obviated by first coating the entire surface of the crystal by vapor deposition of aluminum, then applying a suitable photovarnish and forming thereupon an image of the desired structure or configuration by photographic exposure and development of the photovarnish. The aluminum is thereafter dissolved at the area portions not covered by the masking, and then removed from those localities of the semiconductor systems where it does not perform any function in the finished circuit.

Semiconductor systems, particularly silicon planar components, require the aluminum to be allowed into the silicon for achieving an ohmic contact between the aluminum conducting paths and the component system laid bare at the contact openings. As a rule, the alloying process impairs the surface-dependent properties, such as the blocking current values, the current amplifying gain, and the noise behavior.

Furthermore, it is desirable to keep the etching time for producing the metal structure as short as possible, as prolonged etching may result in swelling the photovarnish thus lifting it from the localities where it covers the contact paths. The consequence of such effects is considerable under-etching whicxh substantially affects the contour sharpness of the finest metal structures to be imaged.

It is, therefore, an object of my invention to shorten the etching periods in the production of very fine metal structures, without affecting the uniformity of the etching. It is a concurrent object to stabilize also the surface of the semiconductor body to a great extent and thus reducing detrimental effects of undesired impurities.

To achieve these objects and in accordance with the method of my invention, I employ aluminum for the production of the whole-area metal deposition and use nickel and/or titanium as an additional metal.

This process of my invention affords the possibility of performing a reliable etching of finest conducting path geometries of aluminum. The addition of nickel and/or titanium during the vaporization stage has the effect that the etching periods for producing the metal structures are reduced approximately by the factor 2 to 3 relative to the etching of pure aluminum layers. This is particularly favorable with respect to the adhesion of the varnish covering the contact paths. Without much difficulty or expenditure, the invention thus achieves the production of reproducibly small under-etching effects, these being smaller than 0.5 μm.

The differences in the etching periods when using layers consisting of aluminum only, and layers containing an addition of nickel, are apparent from the following Table I:

Table I

| Wafer No. | Nickel addition in % | Etching time in mins. |
|---|---|---|
| 1 | 0 | 20 |
| | 0.37 | 7 |
| 2 | 0 | 15 |
| | 0.37 | 7 |
| 3 | 0 | 17 |
| | 0.74 | 7.5 |
| 4 | 0 | 12 |
| | 0.37 | 6.5 |
| | 1.2 | 5 |
| | 1.8 | 4 |

The method according to the invention may be performed, for example, by depositing the additional metal prior to the deposition of aluminum. Another way of performing the process is to use an arrangement in which the additional metal is brought upon the surface after performing the aluminum vapor deposition. However, it is particularly advantageous to simultaneously deposit both metals upon the entire surface. The layer thickness of the deposited metal layer may be set for example to approximately 1 μm, preferably to 0.5 μm. The metal deposition onto the surface is effected either by vaporization in vacuum at 5 to $8.10^{-6}$ Torr or by cathode sputtering.

According to one embodiment of the invention, an alloy of the metals to be precipitated is employed as vapor source. The share of the additional metal may be so chosen that it is at most about 0.5% by weight. This limitation is necessary to prevent the deposited aluminum layer from becoming too hard or lose its contactibility. The vapor-deposition conditions are chosen so that the temperature of the vapor source is from 900° to 1000°C, and preferably about 900°C. A favorable rate of vapor deposition is approximately 30 A/sec.

My invention is particularly applicable for the production of semiconductor components such as silicon planar transistors and silicon planar diodes, since the noise properties of these devices are considerably improved by stabilization of the surface.

Furthermore, the invention avoids or minimizes not only surface noise but also contributes to the stabilization of other surface-dependent electrical parameters, for example surface recombination, blocking voltage or blocking current, as well as current amplifying gain at low collector currents.

For these reasons, the method according to the invention is also advantageous in the production of integrated semiconductor circuits, as well as for the field-effect and MOS-transistors.

The improvement of the surface-dependent electrical parameters can be explained by the fact that nickel or titanium becomes built into the silicon dioxide layer, especially into the upper-most layer of silicon dioxide, during the vaporization and alloying-in of the large-area metal deposition. This produces similar stabilizing qualities as those known with phosphorus glasses and boron oxide glasses. In addition, it has been found that when using titanium, not only the surface properties, but also the electrical contact are favorably influenced. After dissolving the covering varnish and a suitable cleaning of the surface, the aluminum contacts are alloyed into the silicon under protective gas. During this manufacturing stage, there often occurs an increase in the residual currents of the blocking characteristics. The nickel addition, apparently, has a favorable effect upon the surface properties responsible for such increase, because the impairment of the characteristics occurs to a lesser extent than with layers consisting of aluminum only. As a result, the tempering periods for adjusting the final condition become shortened. Wafers with a nickel addition recuperate by a tempering at 300°C in a nitrogen current more rapidly than those without a nickel addition. This can be seen from Table II.

Table II

| Wafer No. | $J_R$ [n A] 0 % Ni | 0.74 % Ni | 1.2 % Ni | 1.8 % Ni | t [h] |
|---|---|---|---|---|---|
| 305 c | 240 | | 140 | 22 | 0 |
| | 3.5 | | 2.3 | 1.9 | 2 |
| | 3.0 | | 2.5 | 1.9 | 18 |
| | 1.2 | | 1.2 | 1.2 | 88 |
| 307 a | $1.3 \cdot 10^6$ | $1.3 \cdot 10^5$ | | | 0 |
| | $3.8 \cdot 10^5$ | $1.7 \cdot 10^4$ | | | 0.5 |
| | $1 \cdot 10^3$ | 13 | | | 3 |
| | 3 · 2 | 1 · 3 | | | 23.5 |
| | 1 · 9 | 1 · 2 | | | 81 |

Furthermore, it has been found that after a subsequent long-time tempering, the residual currents of aluminum-vaporized and aluminum-nickel-vaporized systems become nearly equal but that the systems vaporized with a nickel addition exhibit a higher current amplifying gain at low collector currents, compared to those systems produced by vapor deposition of aluminum only.

Investigation of noise conditions obtaining with integrated, three-stage low-frequency amplifiers showed a definite reduction in surface noise when employing a nickel addition. The starting point of the terminal noise is shifted toward lower frequency. This considerably reduces the noise voltage (measured according to the German standards DIN 45411) referred to the amplifier input. The results obtained with two epitaxial test wafers are listed in Table II.

Table III

| Wafer No. | Ni-addition % | Starting point of thermal noise [kHz] | Median noise voltage referred to the input [μV] |
|---|---|---|---|
| 508 c | 0 | ~ 5 | 3.0 |
| | 5 | ~ 1.5 | 2.4 |
| 503 g | 0 | 3 to 10 | 3.8 |
| | 5 | ~ 1.5 | 1.8 |

Figure 2:
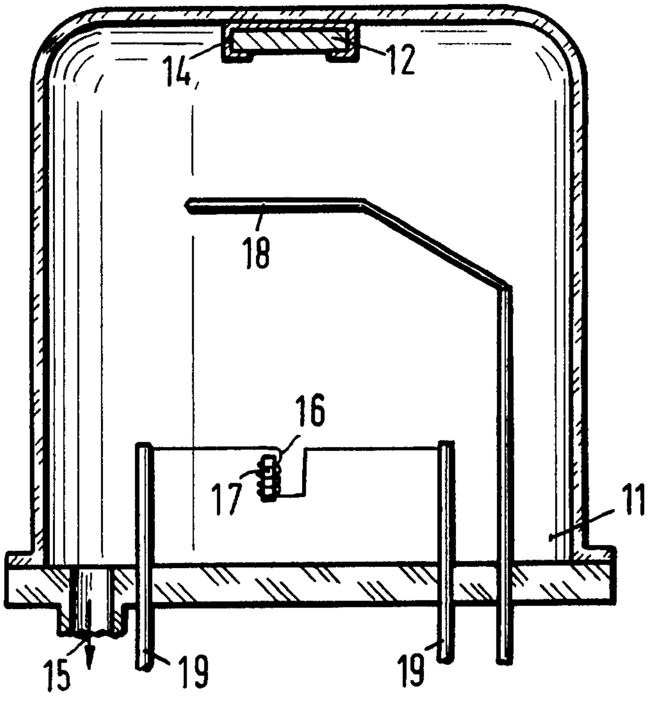

Further details relating to the performance of a process according to the invention will be apparent from the embodiment described in the following and with reference to the accompanying drawing, in which:

FIG. 1 shows schematically and in cross section a semiconductor component made according to the invention; and FIG. 2 shows schematically and in section a device for producing such a component by the method of the invention.

In FIG. 1 there is shown, in section, a monocrystalline wafer 1 of silicon doped, for example with antimony, for n-type conductivity and having a thickness of about 160 μm. Produced in the wafer 1 is a p-doped zone 2 by means of conventional diffusion and phototechniques. Another n-type zone 3 is produced by indiffusion of phosphorus through a window opening (not illustrated) in a dioxide coating covering the zone 2. Due to this phosphorus diffusion, the entire silicon monocrystalline wafer is coated with phosphorus oxide glass. A further window 10 is etched into the glass coating with the aid of the conventional phototechnique and the application of buffered hydrofluoric acid solution. The window 10 serves for attaching a metal contact by the method according to the present invention, so that the portions of the oxide coating on the silicon wafer denoted by 4 will remain. The surface region 7 of the semiconductor body constitutes a metal layer which is produced by depositing a metal upon the entire top surface in accordance with the method of the present invention, this layer 7 consisting of aluminum and nickel. The deposition of the aluminum-nickel composition is effected by vaporization. Thereafter, the crystal wafer is covered with a commercial photovarnish and the desired structures or configurations of the contact members or paths are fixed by photographic exposure and development of the photovarnish. Thereafter, the areas not covered by the resulting mask are dissolved in a conventional etching solution at 60°C. After dissolution of the covering varnish and a suitable cleaning of the surface, the nickel-containing aluminum contacts are alloyed into the silicon under protective gas, and the crystal wafer is then further fabricated for producing a silicon planar transistor.

Vaporization equipment suitable for performing the method according to the invention is exemplified by the apparatus shown in FIG. 2. Prior to vapor deposition of the metal, the monocrystalline wafer of silicon, already provided with the various doped zones and containing a multiplicity of circuit components, is freed in the conventional manner from the photovarnish applied for the purpose of etching the window mentioned above with reference to item 10 in FIG. 1. For each vapor-deposition process, several such crystal wafers are clamped in a holder 14 of tantalum sheet and mounted in a vaporization apparatus comprising a recipient bell 11. The base of the apparatus is connected to an oil-diffusion pump by means of a duct, this being represented by an arrow 15. The evaporator for the metals to be precipitated is constituted essentially by a helical heater winding 16 of tungsten. A body formed of a suitable alloy 17 is placed into the heater helix 16. In the present case, the alloy body 17 consists of aluminum having a content of 0.5% by weight of nickel. Also applicable, however, is an aluminum pellet (about 270 mg) fused in vacuum onto a small piece of nickel sheet having a suitable degree of purity (0.1 to 0.5 mg). The spacing between the evaporator helix 16 and the crystal wafers 12 upon which the metal is to be deposited amounts to approximately 100 mm. The tungsten helix 16 with the alloy 17 is heated by means of current supply leads 19 to a temperature at which the alloy continuously evaporates, a suitable temperature being 900°C, for example. The heating up to the vaporization temperature is effected while a cover diaphragm 18 is kept in the illustrated closed position in which the vapors cannot directly reach the surface of the wafers 12. When the pressure in the recipient 5 has reached $8.10^{-6}$ Torr, the diaphragm 18 is placed to the open position and the metal alloy 17 in the tungsten helix 16 is vaporized at a deposition rate of 30 A/sec. This is continued until the metal coating precipitated upon the semiconductor wafers has grown to the desired thickness, for example of 0.5 $\mu$m.

After removing the crystal wafers from the recipient, they are immediately coated with a commercial photovarnish in a layer thickness of about 0.5 $\mu$m, and are then dried for 15 minutes at 90°C. Thereafter, the photovarnish is photographically exposed through a properly adjusted mask to receive an image corresponding to the desired pattern of the structure or configuration to be produced. Upon developing the exposed photovarnish, the desired geometry or configuration remains preserved and serves as a protective coating or etching mask during the next following etching process. The crystal wafers are etched in an alkaline solution, for example 3% potassium carbonate solution at 60°C for about 10 minutes. The etching does not remove the area portions required for the production of contact areas or paths on planar components leaving configurations of finest path dimensions located beneath the photovarnish layer and exhibiting an excellent contour sharpness and uniformity.

I claim:

1. A semiconductor device comprising a substantially planar semiconductor member having disposed thereon an aluminum layer containing nickel of at most 0.5% to stabilize the semiconductor surface.

2. The semiconductor device of claim 1 wherein said substantially planar member has a given surface area and said aluminum layer covers only a part of said area to provide electrical conducting paths of aluminum.

3. A semiconductor device of claim 1, wherein said semiconductor is silicon.

* * * * *